United States Patent [19]

Krulik

[11] Patent Number: 5,219,484

[45] Date of Patent: Jun. 15, 1993

[54] SOLDER AND TIN STRIPPER COMPOSITIONS

[75] Inventor: Gerald A. Krulik, El Toro, Calif.

[73] Assignee: Applied Electroless Concepts Inc., El Toro, Calif.

[21] Appl. No.: 691,128

[22] Filed: Apr. 25, 1991

[51] Int. Cl.⁵ ............................................. C23D 1/00
[52] U.S. Cl. .................. 252/79.2; 252/79.4; 156/656; 156/664; 134/3; 134/41
[58] Field of Search ............... 252/79.4, 79.2, 79.1; 156/664, 666, 656; 134/3, 41

[56] References Cited

U.S. PATENT DOCUMENTS

| | | | |
|---|---|---|---|
| 3,009,849 | 11/1961 | Bellinger | 252/79.4 |
| 3,052,582 | 9/1962 | Snyder | 252/79.4 |
| 3,647,698 | 3/1972 | Bellinger et al. | 252/79.4 |
| 3,841,905 | 10/1974 | Dixon | 117/212 |
| 3,990,982 | 11/1976 | Dixon | 252/79.3 |
| 4,004,956 | 1/1977 | Brindisi | 156/666 |
| 4,302,246 | 11/1981 | Brindisi, Jr. et al. | 252/79.4 X |
| 4,367,092 | 1/1983 | Unzens | 252/79.1 X |
| 4,410,396 | 10/1983 | Somers et al. | 252/79.4 X |
| 4,439,338 | 3/1984 | Tomaiuolo | 252/79.1 |
| 4,713,144 | 12/1987 | Schiller | 252/79.4 X |
| 4,851,148 | 7/1989 | Yamasoe et al. | 156/665 X |
| 4,921,571 | 5/1990 | Kukanski et al. | 252/79.4 X |
| 4,964,920 | 10/1990 | Jackson et al. | 252/79.4 X |
| 4,980,076 | 12/1990 | Tanaka et al. | 252/79.2 X |
| 5,017,267 | 5/1991 | Cordani | 252/79.4 X |

FOREIGN PATENT DOCUMENTS 413227  5/1974  U.S.S.R. .................. 252/79.4

*Primary Examiner*—Thi Dang

[57] ABSTRACT

An improved method for rapidly stripping solder or tin from a substrate, such as copper, without adversely affecting the substrate. This is especially useful in the preparation of printed circuit boards. The composition comprises an acidic solution of an iron salt, a nitrate, at least one complexing agent such as gluconate, citrate, or EDTA, and at least one acid source. The acid source can comprise any mixture of compatible mineral and organic acids in any combination. The organic acids can include soluble aliphatic, substituted aliphatic, aromatic, or mixed acids. The mixture should be substantially free of halides and sulfates. This highly stable, rapid stripping rate formulation gives no attack on exposed glass fibers or epoxy printed circuit laminate material. It can operate over a wide temperature range without needing close temperature control.

8 Claims, No Drawings ial number 5,219,484

SOLDER AND TIN STRIPPER COMPOSITIONS

BACKGROUND OF THE INVENTION

1. Field of the Invention

This invention relates to stripping tin/lead or tin deposits from copper substrates and more particularly, it comprises new and improved compositions for rapidly stripping tin/lead or tin deposits without substantial attack on the copper substrate, the glass fiber used in printed circuit boards, or on other printed circuit board components, while using materials of substantially lower toxicity and improved biodegradability than solder strippers known in the prior art.

2. Background and Prior Art

Numerous acidic compositions have been patented for use in selectively stripping tin and tin/lead alloys from copper substrates. The great majority of these compositions have been based on the use of fluoride, bifluoride, or fluoborate salts to form soluble tin and lead compounds. The oxidants used in these compositions is typically hydrogen peroxide, or occasionally other oxidants such as nitrobenzene sulfonic acids. U.S. Pat. No. 3,841,905 (1974) to Dixon discloses mixtures of ammonium bifluoride and hydrogen peroxide. U.S. Pat. No. 3,677,949 (1972) to Brindisi et al discloses and claims acidic solutions for selectively stripping tin or tin-lead alloys from copper substrates. These solutions consist of aqueous mixtures of a nitro-substituted aromatic compound having one or more —NO2 groups plus a water solubilizing group attached to the aromatic ring; an inorganic acid giving water soluble tin and lead salts such as fluoboric and hydrofluoric acids; a thiourea to prevent stripped tin from redepositing on the bared copper; and a low molecular weight acidic accelerator such as formic or acetic acid. U.S. Pat. No. 4,004,956 (1977) to Brindisi discloses the additional accelerating effect of an added haloacetic acid such as chloroacetic or bromoacetic acid.

Fluoride salts are toxic and relatively difficult to remove from waste waters. Fluoborate salts are less toxic but are very difficult to remove from waste waters. These materials can interfere with municipal waste treatment processes, and are very undesirable in any recycled water systems. All fluoride and fluoborate salts and acids have the disadvantage of attacking silicaceous materials such as the glass fibers used in printed circuit boards.

Hydrogen peroxide is the most commonly used oxidant, but it suffers from several disadvantages. Hydrogen peroxide is poorly stable on storage or use, and usually requires special additives to decrease its decomposition rate. Concentrated hydrogen peroxide is an extremely hazardous material. Acidic compositions using hydrogen peroxide release heat as they strip tin and tin/lead, increasing the strip rate and the hydrogen peroxide decomposition rate in an uncontrolled manner.

U.S. Pat. No. 3,990,982 (1976) to Dixon discloses that a hydrogen peroxide stabilizer is necessary to reduce the decomposition rate. The stabilizers include organic amines, phosphate complexes, and chelating agents. These stabilizers must be controlled within a narrow range, with too high a concentration inhibiting solder stripping while too low a concentration in ineffective in stabilizing the hydrogen peroxide.

SUMMARY OF THE INVENTION

The composition of the present invention contains no toxic fluoride salts, nor unstable hydrogen peroxide. The stripper formulations were designed to be essentially nontoxic in municipal treatment facilities once the heavy metals are removed and the excess acidity neutralized. The components consist mainly of biodegradable organic acids or salts, biodegradable nitrates, and nontoxic iron salts.

The composition comprises an acidic solution of an iron salt, a nitrate, at least one complexing agent such as gluconate, citrate, or EDTA (ethylenediamine tetraacetic acid), and at least one acid source. The concentration of complexing or chelating agent is from 1 to 100 grams per liter and preferably from 10 to 80 grams per liter.

The most economical iron salt is ferric nitrate, though other soluble iron salts can be used, such as ferric ammonium nitrate, ferric citrate, ferric ammonium citrate, and so forth. Ferric nitrate, alone or mixed with nitric acid, does not strip tin/lead solder quickly at room temperature. It was discovered that organic acids which can form soluble tin or lead salts, especially gluconic acid, citric acid, and other complexing agents such as EDTA (ethylenediamine tetraacetic acid), NTA (nitrilotriacetic acid), and Mazeen 173 (1,1',1'',1'''-(ethylenedinitrilo)tetra-2-propanol) greatly increase the solder strip rate. Other mineral or organic acids can be used to modify the acidity, even if they are not chelating agents. The stripping rate increases at a lower pH, preferably below pH 2. The acidity can be modified by use of only organic acids, or by additions of inorganic acids such as nitric acid, methanesulfonic acid, and sulfamic acid. Sulfate and halide anions are not desirable components of this composition, as they tend to depress the stripping rate and often form poorly soluble films on the solder surface.

The components of the novel stripper composition react together to give a synergistic mix of desirable properties. The chemical mixture is stable, needing no special storage care either before or during use. The composition strips rapidly at room temperature with a negligible isotherm or heat release during stripping. The composition attacks copper much more slowly than it does tin or tin/lead. The composition easily removes copper/tin intermetallic layers along with any tin or tin/lead top coatings in a single step. Tin redeposition on the stripped and exposed copper is minimal or nonexistent. The common use of toxic and carcinogenic thiourea to prevent tin redeposition is avoided as being unnecessary with these formulations.

Although the novel stripper combinations work well at room temperature, they are also effective at an elevated temperature. There is no known limit to the operating temperature of these strippers, since they are not subject to spontaneous decomposition such as is common to hydrogen peroxide based strippers. This has the additional advantage in that close temperature control, such as heating to specific temperatures, or cooling to maintain desired maximum temperatures during repeated stripping operations, is unnecessary with these formulations.

DESCRIPTION OF THE PREFERRED EMBODIMENTS

Although the disclosure hereof is detailed and exact, the formulations listed in the examples are merely illustrative of the useful stripper formulations. Any formulator skilled in the art can utilize these examples and this concept to prepare many workable solutions in addition to those shown in the examples.

The test materials used for stripping consisted of deposits of nominal 60/40 weight percent tin/lead solder or of pure electroplated tin. The solder or tin can be applied by any known method, most commonly by immersion in or application by a molten metal or solder alloy, or by electroplating or immersion plating a deposit from any standard plating bath.

EXAMPLES

Examples 1–6

Test pieces were copper-clad double sided printed circuit boards electroplated with 7.5 micron (0.3 mil) of 60/40 tin/lead solder. They were immersed in the stripper test solution to evaluate the speed and completeness of stripping, the color of the exposed copper, and the attack on the exposed copper.

Prepared Base test solution, at 20.4% ferric nitrate, 5.1% nitric acid, 3.4% gluconic acid, 6.8% acetic acid, and 6.8% citric acid.

Example 1. The solution consisted of the Base solution only; pH=0.04. Stripping time was 5.5 minutes.

Example 2. The solution consisted of the Base solution without ferric nitrate; pH=−0.01. After 15 min, there was no solder strip.

Example 3. The solution consisted of the Base solution without nitric acid; pH=0.06. After 15 minutes, approximately 90% of the coating was stripped.

Example 4. The solution consisted of the Base solution without gluconic acid; pH=−0.22. After 15 minutes, less than 25% of the solder coating was stripped.

Example 5. The solution consisted of the Base solution without acetic acid; pH=−0.19. Stripping time was 5.5 minutes.

Example 6. The solution consisted of the Base solution without citric acid; pH=−0.23. Stripping time was 3 minutes.

The three essential components are shown to be iron, gluconate, nitrate, and hydrogen ion for acidity. Omission of any of these three materials gave an unusable stripper.

Examples 7–10

These solutions were prepared with the three essential ingredients, ferric ions, nitrate ions, an organic complexer (gluconate), and a mixture of inorganic and organic acids (nitric and gluconic). The basic mixture is shown in Example 7. Example 8 shows the addition of a second complexer, citrate. Example 9 shows the addition of both a second complexer and a mineral acid, methylsulfonic. Example 10 shows the addition of a second mineral acid. These extra ingredients may serve to increase operating life, decrease base copper etch rate, give a more economical working solution, or influence ease of waste treatment.

Example 7. The solution consisted of 24% ferric nitrate, 6% nitric acid, 4% gluconic acid; pH=−0.28. This stripped in 45 seconds.

Example 8. The solution consisted of 24% ferric nitrate, 6% nitric acid, 4% gluconic acid, 8% citric acid; pH=−0.31. This stripped in 5.5 minutes.

Example 9. The solution consisted of 24% ferric nitrate, 6% nitric acid, 4% gluconic acid, 8% citric acid, 5.5% methyl sulfonic acid; pH=−0.42. This stripped in 6 minutes.

Example 10. The solution consisted of 24% ferric nitrate, 6% nitric acid, 4% gluconic acid, 5.5% methylsulfonic acid; pH=−0.35. This stripped in 65 seconds.

Example 11. The solution consisted of 24% ferric nitrate, 6% nitric acid, 4% gluconic acid, 8% acetic acid, 3% sulfamic acid, 5.5% methylsulfonic acid, and 4.5% potassium nitrate; pH=−0.46. This stripped in 65 seconds.

Examples 12–14

The basic test solution was 20.4% ferric nitrate, 5.1% nitric acid, 6.8% acetic acid, 4.6% methylsulfonic acid, 4.5% potassium nitrate, and 2.5% sulfamic acid. The gluconic acid was left out, and replaced with a different complexing agent. To the base solution was added 4% of complexing agent chosen from Na2EDTA, NTA, and Mazeen 173 (Mazer Chemical Co).

Example 12. The solution consisted of the Basic solution plus NTA complexer; pH=−0.53. Strip time was 8.5 min.

Example 13. The solution consisted of the Basic solution plus EDTA complexer; pH=−0.54. Strip time was 5.5 min.

Example 14. The solution consisted of the Basic solution plus Mazeen 173 complexer; pH=−0.46. Strip time was 9 min.

Examples 15–16

These formulations are also useful for tin stripping. The test panels were copper-clad double sided printed circuit boards electroplated with 2.5 micron (0.1 mil) of tin. They were immersed in the stripper test solution to evaluate the speed and completeness of stripping, the color of the exposed copper, and the attack on the exposed copper.

Example 15. The solution consisted of 24% ferric nitrate, 6% nitric acid, 4% gluconic acid, 8% acetic acid, 5.5% methyl sulfonic acid, 3% sulfamic acid, and 4.5% potassium nitrate; pH=−0.52. This stripped the tin in 150 seconds.

Example 16. The solution consisted of 20.4 % ferric nitrate, 5.1% nitric acid, 6.8% acetic acid, 5.5% methylsulfonic acid, and 4.5% potassium nitrate. The gluconic acid was replaced with 4% NTA complexer; pH−0.53. This stripped the tin in 12 minutes.

What is claimed is:

1. An acidic solution having a pH of less than 1.0 for selectively stripping tin or tin/lead coatings from a copper substrate consisting essentially of ferric nitrate, an alkali metal nitrate, a chelating agent and nitric acid, wherein the concentration of said chelating agent is from 1 to 100 grams per liter, and the concentration of acid is sufficient to impart a pH of less than 1.0 to said solution and wherein said chelating agent is selected from the group consisting of gluconic acid, citric acid, ethylene diaminetetraacetic acid, nitrilotriacetic acid and 1,1'1", 1'" ethylene dinitrilo tetra-2-propanol and mixtures thereof.

2. The solution of claim 1 wherein said alkali metal nitrate is potassium nitrate.

3. The solution of claim 1 wherein the chelating agent is gluconic acid.

4. An acidic solution having a pH of less than 1.0 for selectively stripping tin or tin/lead coatings from a copper substrate consisting essentially of ferric nitrate, a chelating agent, nitric acid, and at least one organic acid selected from the group consisting of acetic acid, methyl sulfonic acid, and sulfamic acid, wherein the concentration of said chelating agent is from 1 to 100 grams per liter, and the concentration of acid is sufficient to impart a pH of less than 1.0 to said solution and wherein said chelating agent is selected from the group consisting of gluconic acid, citric acid, ethylene diaminetetraacetic acid, nitrilotriacetic acid and 1,1',1",1" ethylene dinitrilo tetra-2-propanol and mixture thereof.

5. The solution of claim 4 wherein the chelating agent is gluconic acid.

6. An acidic solution having a pH of less than 1.0 for selectively stripping tin or tin/lead coatings from a copper substrate consisting essentially of ferric nitrate, an alkali metal nitrate, a chelating agent and an organic acid and nitric acid, wherein the concentration of said chelating agent is from 1 to 100 grams per liter, and the concentration of acid is sufficient to impart a pH of less than 1.0 to said solution and wherein said chelating agent is selected from the group consisting of gluconic acid, ethylene diaminetetraacetic acid, nitrilotriacetic acid and 1,1',1",1" ethylene dinitrilo tetra-2-propanol and mixtures thereof, and said organic acid is selected from the group consisting of acetic acid, methyl sulfonic acid and sulfamic acid.

7. The solution of claim 6 wherein said alkali metal nitrate is potassium nitrate.

8. The solution of claim 6 wherein the chelating agent is gluconic acid.

* * * * *